United States Patent [19]
Choi et al.

[11] Patent Number: 5,594,377
[45] Date of Patent: Jan. 14, 1997

[54] DELAY CIRCUIT FOR A WRITE DATA PRECOMPENSATOR SYSTEM

[75] Inventors: Davy H. Choi, Garland; William H. Giolma, Dallas, both of Tex.; Owen Lee, Hsin-Tien, Taiwan

[73] Assignee: Texas Instruments Incorporated, Dallas, Tex.

[21] Appl. No.: 528,169

[22] Filed: Sep. 14, 1995

Related U.S. Application Data

[63] Continuation of Ser. No. 188,265, Jan. 27, 1994, abandoned.

[51] Int. Cl.$^6$ .................................................. H03H 11/26
[52] U.S. Cl. ......................... 327/278; 327/154; 327/161; 327/276
[58] Field of Search ..................................... 327/141, 154, 327/161, 276, 278, 283, 262

[56] References Cited

U.S. PATENT DOCUMENTS

| | | | |
|---|---|---|---|
| 3,763,317 | 10/1973 | Coleman, Jr. et al. | 327/154 |
| 4,581,585 | 4/1986 | Bristol | 327/276 |
| 4,914,325 | 4/1990 | Yamada | 327/141 |
| 4,985,639 | 1/1991 | Renfrow et al. | 327/161 |
| 5,111,150 | 5/1992 | Casey | 327/141 |
| 5,124,597 | 6/1992 | Stuebing et al. | 327/276 |

*Primary Examiner*—Terry Cunningham
*Attorney, Agent, or Firm*—W. Daniel Swayze, Jr.; W. James Brady, III; Richard L. Donaldson

[57] ABSTRACT

A write data precompensator system is described which comprises a delay element circuit (12) which receives a clock signal and outputs a delayed clock signal which includes a programmable selectable delay in the rising edge of the clock signal. The amount of delay is received using a delay voltage level generated by a delay level circuit (16) which receives delay magnitude control values in digital form. A reference level circuit (18) also generates a continuous level voltage level so that the delay element circuit (12) can instantly change between a delayed operation and an undelayed operation without waiting for the delay voltage level to adjust.

7 Claims, 3 Drawing Sheets

5,594,377

DELAY CIRCUIT FOR A WRITE DATA PRECOMPENSATOR SYSTEM

This application is a continuation of application Ser. No. 08/188,265, filed Jan. 27, 1994 now abaneoned.

TECHNICAL FIELD OF THE INVENTION

This invention relates in general to the field of electronic systems and more particularly to an improved delay circuit for a write data precompensator system.

BACKGROUND OF THE INVENTION

When outputting data during a write operation to a data storage system such as a disk drive, it is sometimes advantageous to delay a clock edge slightly in order to precompensate for data interaction on the storage medium. For disk storage media and other storage media, this delay is variable in length in order to optimize efficient data storage on the disk or other storage medium.

Prior systems and methods of allowing for this delay have interposed a delay element in the clock signal path which can be selectively triggered depending upon the data being written. However, in high data transfer rate operations, the time necessary for the delay element to settle on an appropriate delay time reduces the throughput available to the integrated system.

SUMMARY OF THE INVENTION

Accordingly, a need has arisen for a delay element in a write data precompensator that allows for programmable delay of the write data clock signal without impeding the data transfer rate of the integrated system.

In accordance with the teachings of the present invention, a delay element for a write data precompensator system is provided that substantially eliminates or reduces disadvantages associated with prior art systems and method of operation.

According to one embodiment of the present invention, a write data precompensator system is provided that comprises a delay element operable to receive a clock signal and operable to output a delayed clock signal. The delay element receives both a programmable delay voltage level and a reference voltage level. The programmable delay voltage level is operable to set the delay time for the delayed clock signal. The reference voltage level causes the delay element to output a substantially undelayed clock signal. The programmable delay voltage level and the reference voltage level are available to the delay element circuit on a continuous basis such that the delay element and the integrated system are not slowed by the calculation of a particular delay value.

BRIEF DESCRIPTION OF THE DRAWINGS

A more complete understanding of the teachings of the present invention may be acquired by referring to the Detailed Description of the Invention taken in conjunction with the accompanying drawings in which like reference numbers indicate like features and wherein.

DETAILED DESCRIPTION OF THE INVENTION

Figure 1:
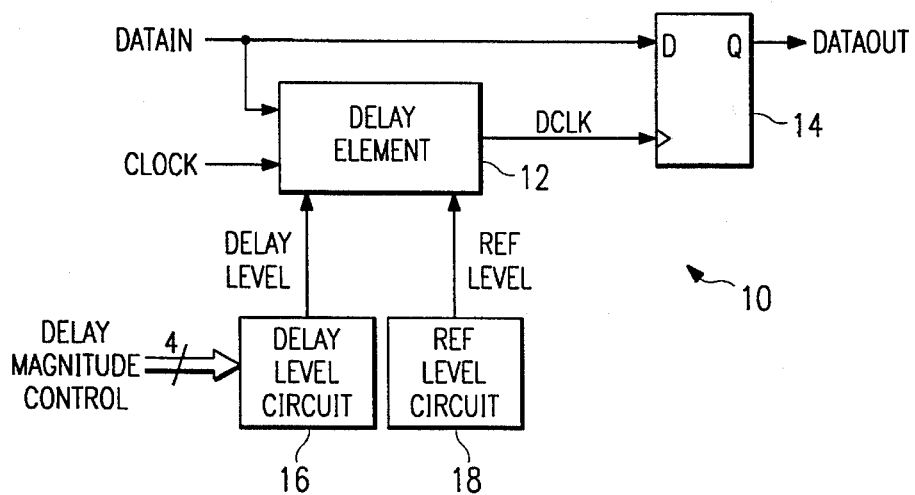
FIG. 1 is a schematic block diagram of a write data precompensator including a delay element circuit constructed according to the teachings of the present invention.

Referring to FIG. 1, a block diagram of a write data precompensator system indicated generally at 10 is illustrated. System 10 comprises a delay element circuit 12 which receives a clock signal and an input data signal DATAIN and outputs a delayed clock signal DCLK. The delay element 12 selectively delays the rising edge of the clock signal responsive to the values of the DATAIN signal. The DATAIN signal comprises a conventional logic level square wave signal which represents a series of bits of information. According to one embodiment of the present invention, the delay element 12 will delay the rising edge of a transition of the clock signal to create the DCLK signal by a programmable amount each time the last two bits of the DATAIN signal are different. The DCLK signal is used to latch the incoming data from the DATAIN signal into a latch circuit 14 which generates a DATAOUT signal.

The delay element 12 delays the rising edge of a particular transition of the clock signal by an amount proportional to a delay voltage level input from a delay level circuit 16. The delay voltage level is an analog voltage which is formed responsive to a digital delay magnitude control value input into the delay level circuit 16. According to one embodiment of the present invention, the delay magnitude control value comprises a four-bit digital value. The delay level circuit 16 will be described more completely with reference to FIG. 4 herein but essentially functions as a digital-to-analog converter circuit to create the delay voltage level from the programmable delay magnitude control value.

The delay element circuit 12 utilizes a reference voltage level input from a reference level circuit 18 when no delay is required in the clock signal responsive to the value of the last two cycles of the DATAIN signal. As will be discussed more completely herein, an important technical advantage of the system of the present invention inheres in the fact that the delay element circuit 12 can quickly switch from a delay mode to an undelayed mode because both the delay voltage level and the reference voltage level are continuously available to the delay element circuit 12 to create the DCLK signal.

Figure 2:
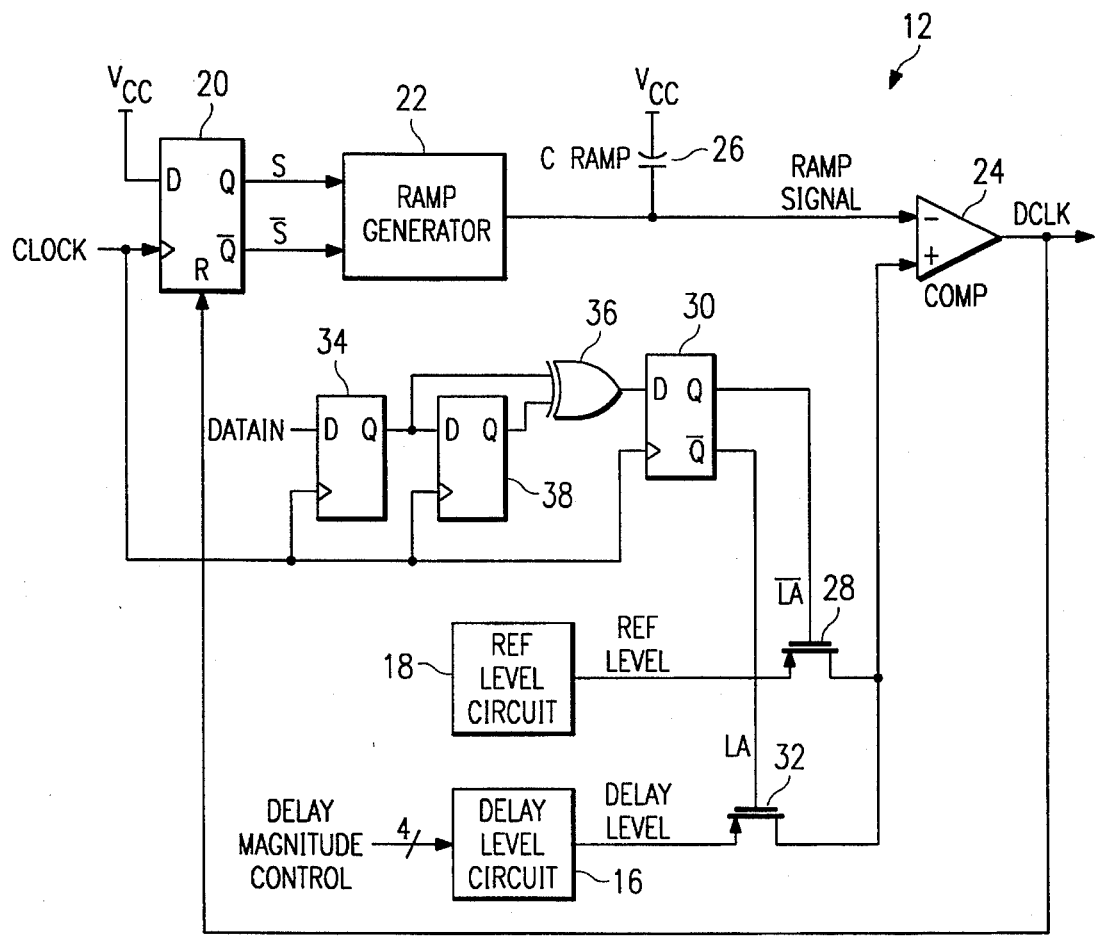
FIG. 2 is a schematic block diagram of a delay element circuit constructed according to the teachings of the present invention.

FIG. 2 is a schematic illustration of one embodiment of delay element circuit 12. Delay element circuit 12 comprises a latch circuit 20. The D input of latch circuit 20 is coupled to the $V_{CC}$ supply voltage and as such is always in a high logic voltage level. The latch circuit 20 receives the clock signal and on every rising edge of the clock signal outputs a pulse signal S and an inverse pulse signal $\overline{S}$ to a ramp generator circuit 22. One possible embodiment of ramp generator circuit 22 will be discussed more fully with reference to FIG. 3 herein. The output of the ramp generator circuit 22 is a RAMP signal which is input into a comparator circuit 24. The output of the ramp generator circuit is coupled to $V_{CC}$ through a capacitor 26 which has a capacitance equal to $C_{RAMP}$.

In operation, with every rising edge of the clock signal, the ramp generator circuit 22 outputs a RAMP signal to the comparator 24 which is a steadily linearly-descending voltage level. The comparator 24 compares the steadily descending voltage level of the RAMP signal to a constant voltage level which is received either from the reference level circuit 18 or the delay level circuit 16 shown in FIG. 2. The reference voltage level output by the reference level circuit passes to the comparator 24 through a p-channel switching transistor 28 which is actuated by an inverse late signal $\overline{LA}$ received from a latch 30. Similarly, the delay voltage level output by delay level circuit 16 passes to the comparator 24 through a p-channel switching transistor 32 which is actuated by a late signal LA received from the latch 30. The LA signal and the $\overline{LA}$ signal are complementary signals output by latch 30.

The latch 30 controls whether or not a delay is inserted in the clock signal to create the DCLK signal by controlling whether or not the reference voltage or the delay voltage level is input into comparator 24.

The cycles of the DATAIN signal are input into a latch 34 which also receives the clock signal. The non-inverting output Q of the latch 34 is input into an exclusive OR gate 36 and to the D input of a latch 38. Latch 38 also receives the clock input. The non-inverting output of the latch 38 is input into the remaining input of the exclusive OR gate 36.

In operation, the last two cycles of the DATAIN signal are stored in latches 34 and 38 and their values are input into exclusive OR gate 36. If the last two values are different, the output of exclusive OR gate 36 is high and is input into the latch 30. A logic level 1 stored in latch 30 causes the transistor 32 to conduct the delay voltage level to the comparator 24. Similarly, a logic level 0 within latch 30 causes the transistor 28 to conduct the reference voltage level to the comparator 24.

In operation, the RAMP signal output by ramp generator circuit 22 decays with time as current discharges the capacitor 26. When the voltage level of the ramp signal decreases to the level at the remaining input of the comparator 24, the DCLK signal goes high. In this manner, the amount of delay of the rising edge of the clock signal demonstrated in the DCLK signal can be adjusted by adjusting the delay voltage level signal output by delay level circuit 16. A small voltage level output by delay level circuit 16 will create a long delay. Similarly, the reference voltage level corresponding to an undelayed clock signal is very close to $V_{CC}$. The DCLK signal is fed back to the latch 20 and input into the reset input of latch 20. In this manner, the delayed clock signal DCLK is used to reset the delay element circuit 12 prior to the next rising edge of the clock signal.

Figure 3:
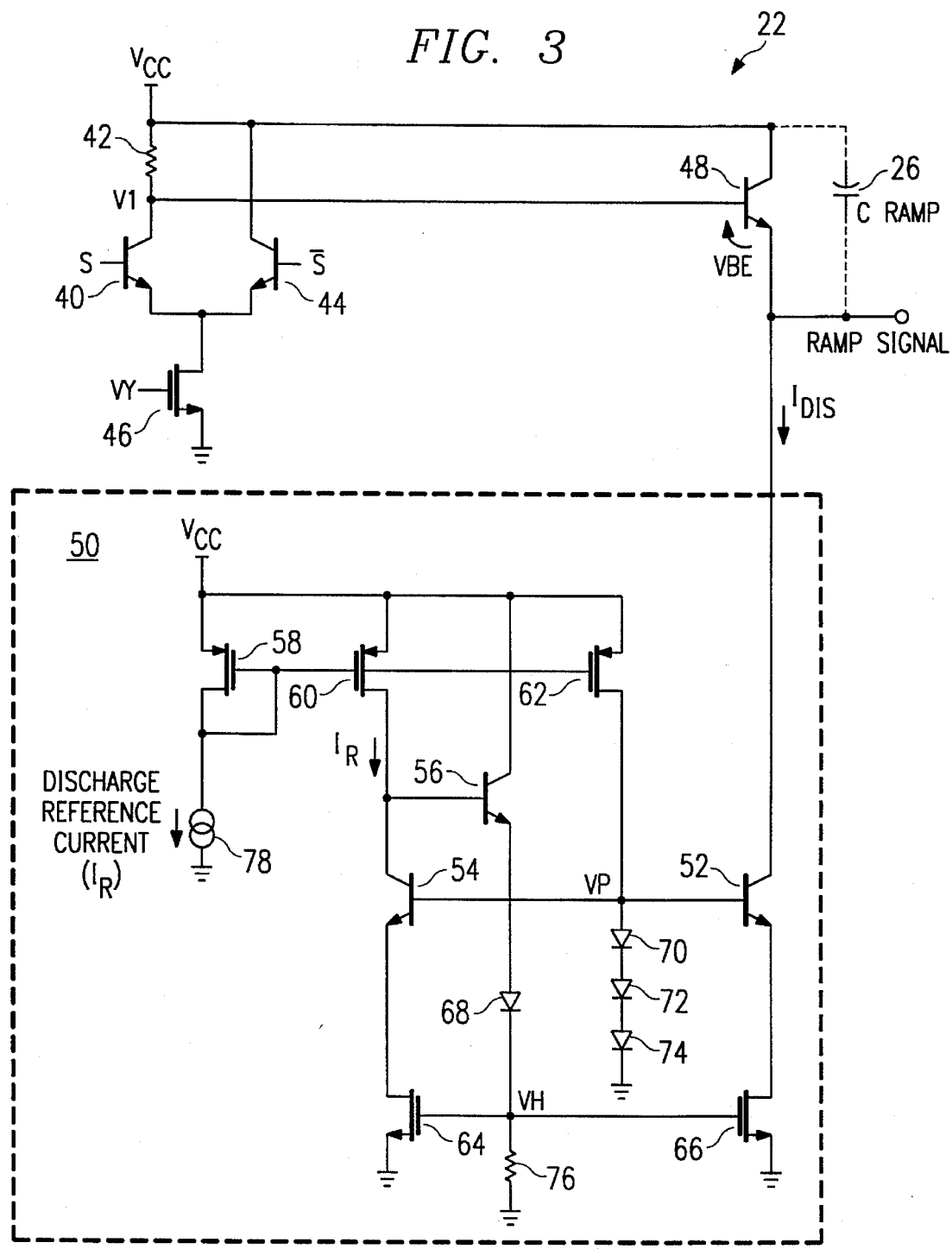
FIG. 3 is a schematic illustration of a ramp generator circuit constructed according to the teachings of the present invention.

FIG. 3 is a schematic illustration of one embodiment of the ramp generator circuit 22. As discussed previously, ramp generator circuit 22 serves to generate a constantly decaying voltage level whenever a rising edge of the clock signal is received. Referring to FIG. 3, the actuation signal S generated by the latch 20 is input into the base of an npn bipolar transistor 40. The collector of transistor 40 is coupled to $V_{CC}$ through a resistor 42. The inverse actuation signal $\overline{S}$ is coupled to the base of a bipolar npn transistor 44. The emitter of transistor 44 is coupled to the emitter of transistor 40. The collector of transistor 44 is coupled to the $V_{CC}$ supply voltage. The emitters of transistors 40 and 44 are coupled to the drain of an n-channel field effect transistor 46. The source of transistor 46 is coupled to ground potential. The gate of transistor 46 is coupled to a reference voltage $V_y$. The node between resistor 42 and the collector of transistor 40 generates a voltage $V_1$ which is transmitted to the base of a bipolar npn transistor 48. The collector of transistor 48 is coupled to $V_{CC}$ supply voltage. The emitter of transistor 48 is coupled to a constant current source 50, which generates a discharge current $I_{DIS}$. The discharge current $I_{DIS}$ flows through transistor 48 when $V_1$ reaches $V_{CC}$ which is the case when S is less than $\overline{S}$. In other words, the discharge current, $I_{DIS}$ either flows through transistor 48 or flows through capacitor 26.

One embodiment of a constant current source 50 that will operate advantageously according to the teachings of the present invention is shown in FIG. 3 to comprise npn transistors 52, 54 and 56 coupled as shown in FIG. 3. In addition, current source 50 comprises p-channel field effect transistors 58, 60, and 62, and n-channel transistors 64 and 66 coupled as shown in FIG. 3. Diodes 68, 70, 72 and 74 and resistor 76 coupled as shown in FIG. 3 are used to appropriately bias the components of constant current source 50. A discharge reference current $I_R$ is generated in a current source 78 to provide the drive current for current source 50. The particular embodiment of current source 50 is not critical to the teachings of the present invention. Current source 50 must merely provide a discharge current which is substantially constant regardless of the state of transistor 48 such that the RAMP signal emitted from the emitter of transistor 48 will decay in a linear fashion. As shown in FIG. 3, the capacitor 26 is coupled between the emitter of transistor 48 and the $V_{CC}$ supply voltage. In operation, the voltage of the RAMP signal starts at approximately $V_{CC}$ minus the base emitter voltage of transistor 48. When the $\overline{S}$ signal is less than the S signal, the voltage $V_1$ goes low, transistor 48 turns off and the discharge current $I_{DIS}$ from current source 50 must flow through capacitor 26. When the $\overline{S}$ signal is greater than the S signal, $V_1$ goes toward $V_{CC}$ and transistor 48 turns on and absorbs the discharge current, $I_{DIS}$. The discharge current $I_{DIS}$ discharges the capacitor 26 causing the RAMP signal voltage to drop in a substantially linear fashion as the capacitor charges.

Figure 4:
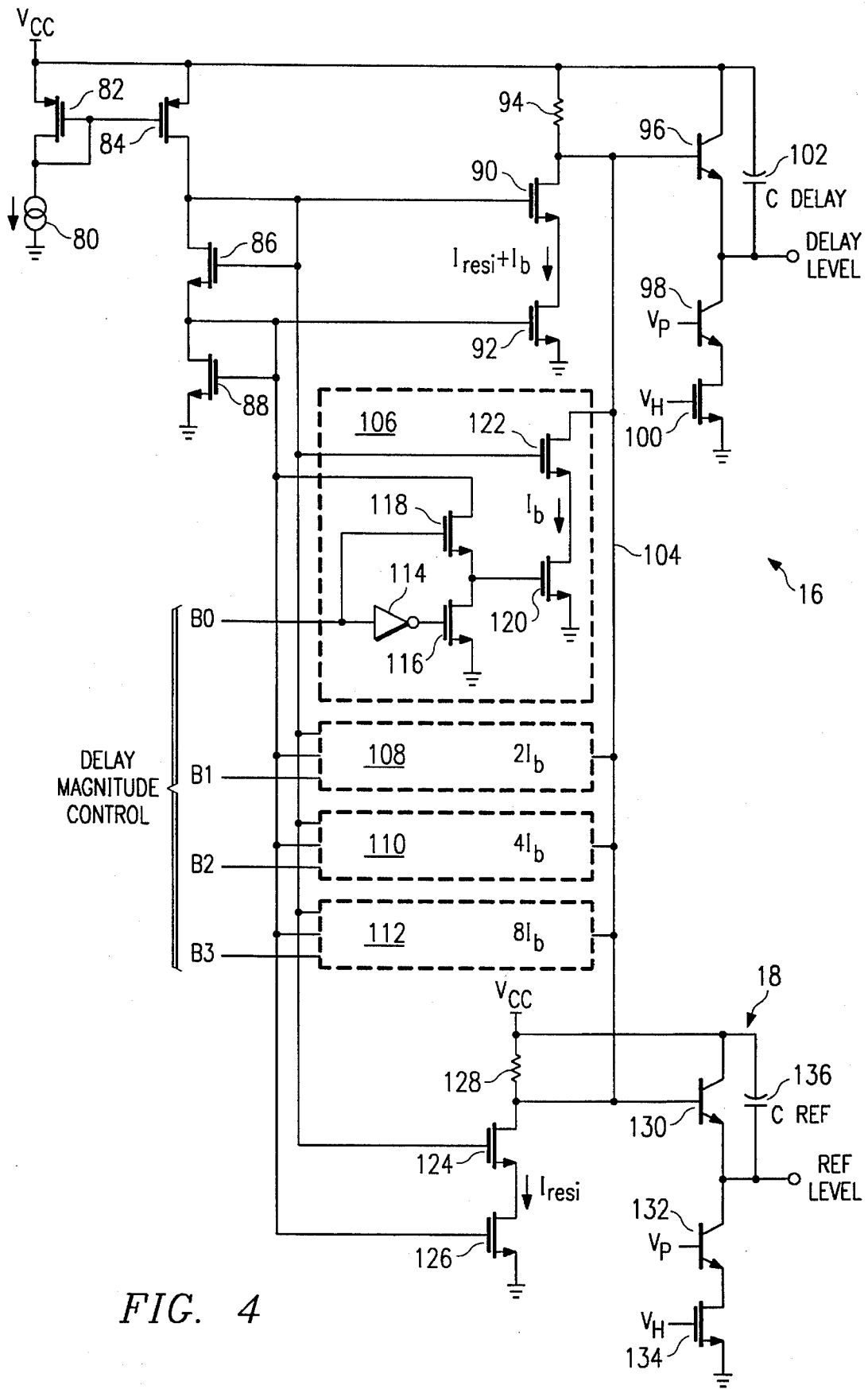
FIG. 4 is a schematic illustration of a reference voltage level and delay voltage level generating circuit constructed according to the teachings of the present invention.

FIG. 4 is a schematic illustration of one embodiment of delay level circuit 16 and reference level circuit 18. Referring to FIG. 4, a reference current source 80 is coupled between ground potential and the drain and gate of a p-channel field effect transistor 82. The source of transistor 82 is coupled to the $V_{CC}$ supply voltage. The gate of transistor 82 is coupled to the gate of a p-channel field effect transistor 84. The source of transistor 84 is also coupled to the $V_{CC}$ supply voltage. The drain of transistor 84 is coupled to the drain of an n-channel field effect transistor 86. The gate of transistor 86 is also coupled to the drains of transistors 84 and 86. The source of transistor 86 is coupled to the drain and the gate of an n-channel field effect transistor 88. The source of transistor 88 is coupled to ground potential. The gate and drain of transistor 86 are coupled to the gate of an n-channel field effect transistor 90. The gate and drain of transistor 88 are coupled to the gate of an n-channel transistor 92. The source of transistor 90 is coupled to the drain of transistor 92. The source of transistor 92 is coupled to ground potential. The drain of transistor 90 is coupled to the $V_{CC}$ supply voltage through a resistor 94. The drain of transistor 90 is coupled to the base of an npn bipolar transistor 96. The collector of transistor 96 is coupled to the $V_{CC}$ supply voltage. The emitter of transistor 96 is coupled to the collector of an npn bipolar transistor 98. The emitter of transistor 98 is coupled to the drain of an n-channel field effect transistor 100. The source of transistor 100 is coupled to ground potential. The base of transistor 98 is coupled to the $V_P$ voltage associated with constant current source 50 described previously. Similarly, the gate of transistor 100 is coupled to the $V_H$ voltage associated with constant current source 50 described previously. Transistors 98 and 100 form a portion of a constant current source which functions identically to constant current source described previously with reference to FIG. 3.

A capacitor 102 is coupled across the collector and emitter of transistor 96. The delay voltage level is emitted from the emitter of transistor 96. The current passing through resistor 94 is equal to the current passing through transistors 90 and 92 plus the current passing through a line 104 which connects the base of transistor 96 with the selectable current cells 106, 108, 110, and 112. The current cells 106, 108, 110 and 112 serve to pull additional current through line 104 to increase the voltage drop across resistor 94 and to thereby reduce the level of the delay voltage level signal output from the emitter of transistor 96.

The structure of current cell 106 is illustrated in FIG. 4. The structures of current cells 108, 110 and 112 are virtually identical to the structure of current cell 106. A $B_0$ signal from the delay magnitude control group of signals is input into an inverter 114. The output of inverter 114 is coupled to the gate of an n-channel field effect transistor 116. The source of transistor 116 is coupled to ground potential. The drain of transistor 116 is coupled to an n-channel field effect transistor 118. The gate of transistor 118 is coupled to the $B_0$ delay magnitude control signal. The drain of transistor 118 is coupled to the gate and drain of transistor 88 and to the gate of transistor 92. The source of transistor 118 and the drain of transistor 116 are coupled to the gate of an n-channel field effect transistor 120. The source of transistor 120 is coupled to ground potential. The drain of transistor 120 is coupled to the source of an n-channel field effect transistor 122. The drain of transistor 122 is coupled to the line 104 discussed previously. The gate of transistor 122 is coupled to the gate and drain of transistor 86 and to the gate of transistor 90.

In operation, a high voltage level of the $B_0$ delay magnitude control signal causes current to flow through transistors 122 and 120 pulling an additional measure of current from line 104. This amount of current is signified as $I_b$ in FIG. 4.

In similar fashion, if the $B_1$ signal is active, the selectable current source circuit 108 will pull two times the $I_b$ level of current from line 104. Similarly, if the $B_2$ signal is active, the circuit 110 will pull four times the $I_b$ current from line 104 and if the $B_3$ signal is active, the circuit 112 will pull eight times the $I_b$ current level from line 104.

In this manner, the logical values of the delay magnitude control signals $B_0$ through $B_3$ determine the amount of current in line 104 and therefore determine the voltage drop across resistor 94. The voltage drop across the resistor 94 directly affects the voltage level of the delay level signal. Accordingly, the delay level voltage signal is controlled by the digital values of the delay magnitude control signal.

FIG. 4 also illustrates the structure of reference level circuit 18. Referring to FIG. 4, an n-channel field effect transistor 124 has its gate coupled to the gate and drain of transistor 86 and to the gate of transistor 90. The source of transistor 124 is coupled to the drain of an n-channel field effect transistor 126. The source of transistor 126 is coupled to ground potential. The gate of transistor 126 is coupled to the gate and drain of transistor 88 and to the gate of transistor 92. The drain of transistor 124 is coupled to the $V_{CC}$ supply voltage through a resistor 128 which has the same resistance value as resistance value 94. The drain of transistor 124 is also coupled to line 104 and to the base of an npn bipolar transistor 130. The collector of transistor 130 is coupled to the $V_{CC}$ supply voltage. The emitter of transistor 130 is coupled to an npn bipolar transistor 132. The emitter of transistor 132 is coupled to a drain of an n-channel field effect transistor 134. The source of transistor 134 is coupled to ground potential. The base of transistor 132 is coupled to the $V_P$ reference voltage generated as discussed with reference to constant current source 50 described with reference to FIG. 3. Similarly, the gate of transistor 134 is coupled to $V_H$ reference voltage which is generated as described with reference to current source 50 described with reference to FIG. 3 previously. A capacitor 136 is coupled across the collector and emitter of transistor 130. The reference voltage level is output from the emitter of transistor 130 and is substantially equal to $V_{CC}$ minus the base emitter voltage drop of transistor 130 minus the voltage drop across resistor 128. Accordingly, the circuit shown in FIG. 4 supplies the constant delay voltage level signal and the constant reference voltage level signal continuously. These two voltage levels are then supplied on a selectable basis to the comparator 24 described previously. As such, the delay that may be injected into the clock signal by the circuit of the present invention is completely programmable by adjusting the delay magnitude control signals $B_0$ through $B_3$. However, in order to switch between delaying and not delaying a particular clock edge, the system of the present invention need not wait for the delay voltage level to adjust. The reference voltage level associated with no delay of the clock edge is always available so that the circuit can switch from a delayed to an undelayed mode of operation instantly.

An important technical advantage of the present inventions inheres in the fact that the source impedances are matched by matching all inputs to comparator 24. For low frequency operation, only the capacitor 26 is actually required. However, in order to match the source impedances of the signals to comparator 24 for all frequencies, capacitors 102 and 136 are added which are matched to capacitor 26. Further, the output stages driving the RAMP signal, the delay voltage level and the reference voltage level are also matched to provide for constant source impedances. For example, transistors 48, 52 and 66 will handle more current than transistors 96, 98 and 100 respectively. Accordingly, transistors 48, 52, and 66 are sized proportionately larger so that the higher current level is handled while maintaining a matched output impedance. According to the embodiment shown, transistors 96 and 130 are identical, transistors 98 and 132 are identical, and transistors 100 and 134 are identical. Similarly, the current density of transistors 96, 98 and 100 is equal to the current density of transistors 48, 52 and 66.

Although the present invention has been described in detail, it should be understood that various changes, alterations and modifications may be made to the description contained herein without departing from the spirit and scope of the present invention which is solely defined by the appended claims.

What is claimed is:

1. A circuit, comprising:
    a delay element circuit operable to receive a clock signal and to selectively output a delayed clock signal;
    a delay level circuit coupled to the delay element circuit and operable to output a delay voltage level responsive to a digital delay magnitude control signal; and
    a reference level circuit coupled to the delay element circuit and operable to output a reference voltage level to the delay element circuit, the delay element circuit operable to selectively delay or not delay a clock edge of the clock signal responsive to either the delay voltage level or the reference voltage level, wherein the delay element circuit comprises:

a ramp generator circuit operable to generate a ramp signal;

a comparator circuit having first and second inputs, the first input of the comparator circuit coupled to receive the ramp signal generated by the ramp generator circuit; and the second input of the comparator circuit selectively coupled to either the reference level circuit or the delay level circuit, the comparator operable to output the delayed clock signal, where output stages associated with the delay level circuit, the reference level circuit and the ramp generator circuit are matched such that the source impedances to both inputs of the comparator circuit are substantially equal.

2. A circuit, comprising:

a delay element circuit operable to receive a clock signal and to selectively output a delayed clock signal;

a delay level circuit coupled to the delay element circuit and operable to output a delay voltage level responsive to a digital delay magnitude control signal; and a reference level circuit coupled to the delay element circuit and operable to output a reference voltage level to the delay element circuit, the delay element circuit operable to selectively delay or not delay a clock edge of the clock signal responsive to either the delay voltage level or the reference voltage level, wherein the delay element circuit comprises:

a ramp generator circuit operable to generate a ramp signal;

a comparator circuit having first and second inputs, the first input of the comparator circuit coupled to receive the ramp signal generated by the ramp generator circuit; and the second input of the comparator circuit selectively coupled to either the reference level circuit or the delay level circuit, the comparator operable to output the delayed clock signal, wherein said delay element further comprises a select circuit coupled to the delay level circuit and the reference level circuit and operable to receive an input signal and to selectively output the delay voltage level or the reference voltage level to the second input of the comparator circuit responsive to the input signal, the selection of the delay voltage level causing the delay element circuit to delay the clock edge of the clock signal and the selection of the reference voltage level causing the delay element circuit to output the clock signal substantially undelayed.

3. A delay circuit, comprising:

a delay element circuit operable to receive a clock signal and to selectively output a delayed clock signal;

a delay level circuit coupled to the delay element circuit and operable to output a delay voltage level responsive to a digital delay magnitude control signal;

a reference level circuit coupled to the delay element circuit and operable to output a reference voltage level to the delay element circuit, the delay element circuit operable to selectively switch between a delay or a non delay of a clock edge of the clock signal responsive to either the delay voltage level or the reference voltage level; and wherein said delay element circuit further comprises a select circuit coupled to the delay level circuit and the reference level circuit and operable to receive an input signal and to selectively output the delay voltage level or the reference voltage level responsive to the input signal, the selection of the delay voltage level causing the delay element circuit to delay the clock edge of the clock signal and the selection of the reference voltage level causing the delay element circuit to output the clock signal substantially undelayed.

4. A delay circuit, comprising:

a delay element circuit operable to receive a clock signal and to selectively output a delayed clock signal;

a delay level circuit coupled to the delay element circuit and operable to output a delay voltage level responsive to a digital delay magnitude control signal;

a reference level circuit coupled to the delay element circuit and operable to output a reference voltage level to the delay element circuit, the delay element circuit operable to selectively switch between a delay or a non delay of a clock edge of the clock signal responsive to either the delay voltage level or the reference voltage level;

wherein the delay level circuit comprises:

a resistance;

a plurality of selectable current source circuits operable to pull current through the resistance;

the digital delay magnitude control signal being coupled to the plurality of selectable current source circuits and operable to cause at least one of the plurality of selectable current source circuits to pull current through the resistance such that the voltage across the resistance alters responsive to the value of the digital delay magnitude control signal; and the delay voltage signal comprising the voltage across the resistance.

5. A delay circuit, comprising:

a delay element circuit operable to receive a clock signal and to selectively output a delayed clock signal and comprising:

a ramp generator circuit operable to generate a ramp signal;

a comparator circuit having first and second inputs, the first input of the comparator circuit coupled to the ramp signal generated by the ramp generator circuit;

the delay circuit further comprising:

a delay level circuit coupled to the delay element circuit and operable to output a delay voltage level responsive to a digital delay magnitude control signal; and a reference level circuit coupled to the delay element circuit and operable to output a reference voltage level to the delay element circuit, the delay element circuit being operable to selectively switch between a delay or a non delay of a clock edge of the clock signal responsive to either the delay voltage level or the reference voltage level, wherein the second input of the comparator circuit selectively coupled to either the reference level circuit or the delay level circuit, the comparator being operable to output the delayed clock signal, wherein said delay element circuit further comprises a select circuit coupled to the delay level circuit and the reference level circuit and operable to receive an input signal and to selectively output the delay voltage level or the reference voltage level to the second input of the comparator circuit responsive to the input signal, the selection of the delay voltage level causing the delay element circuit to delay the clock edge of the clock signal and the selection of the reference voltage level causing the delay element circuit to output the clock signal substantially undelayed.

6. A circuit, comprising:

a delay element circuit operable to receive a clock signal and to selectively output a delayed clock signal and comprising:

a ramp generator circuit operable to generate a ramp signal;

a comparator circuit having first and second inputs, the first input of the comparator circuit coupled to receive the ramp signal generated by the ramp generator circuit;

the circuit further comprising:

a delay level circuit coupled to the delay element circuit and operable to output a delay voltage level responsive to a digital delay magnitude control signal; and a reference level circuit coupled to the delay element circuit and operable to output a reference voltage level to the delay element circuit, the delay element circuit being operable to selectively switch between a delay or a non delay of a clock edge of the clock signal responsive to either the delay voltage level or the reference voltage level, wherein the second input of the comparator circuit selectively coupled to either the reference level circuit or the delay level circuit, the comparator being operable to output the delayed clock signal;

wherein the delay level circuit comprises:

a resistance;

a plurality of selectable current source circuits operable to pull current through the resistance;

a digital delay magnitude control signal coupled to the plurality of selectable current source circuits and operable to cause at least one of the plurality of selectable current source circuits to pull current through the resistance such that the voltage across the resistance alters responsive to the value of the digital delay magnitude control signal; and the delay voltage signal comprising the voltage across the resistance.

7. A method of selectively delaying a clock edge of a clock signal to create a delayed clock signal, comprising the steps of:

receiving the clock signal in a delay element circuit;

generating a delay voltage level in a delay level circuit responsive to a digital delay magnitude control signal;

generating a reference voltage level in a reference level circuit;

selectively switching between inputting the reference voltage level to the delay element circuit and inputting the delay voltage level from the delay level circuit to the delay element circuit; and selectively delaying the clock edge of the clock signal responsive to either the delay voltage level or the reference voltage level, wherein the step of generating a delay voltage level circuit comprises the steps of:

selectively activating at least one of a plurality of current source circuits responsive to the value of the digital delay magnitude control signal, pulling current though a resistance to the activated current source circuits; and outputting the delay voltage signal as the voltage across the resistance, the digital delay magnitude control signal coupled to the plurality of selectable current source circuits and operable to cause selected ones of the plurality of selectable current source circuits to pull current through the resistance such that the voltage across the resistance alters.

* * * * *